United States Patent
Lee et al.

(10) Patent No.: US 9,170,285 B2
(45) Date of Patent: Oct. 27, 2015

(54) HOME APPLIANCE HAVING BUILT-IN POWER METER

(71) Applicant: LG Electronics Inc., Seoul (KR)

(72) Inventors: Namki Lee, Gyeongnam (KR); Chungill Lee, Gyeongnam (KR)

(73) Assignee: LG Electronics Inc., Seoul (KR)

( * ) Notice: Subject to any disclaimer, the term of this patent is extended or adjusted under 35 U.S.C. 154(b) by 162 days.

(21) Appl. No.: 13/904,519

(22) Filed: May 29, 2013

(65) Prior Publication Data

US 2013/0328544 A1   Dec. 12, 2013

(30) Foreign Application Priority Data

Jun. 12, 2012   (KR) .................. 10-2012-0062579

(51) Int. Cl.
*G01R 22/06* (2006.01)
*G01R 22/00* (2006.01)

(52) U.S. Cl.
CPC ............... *G01R 22/06* (2013.01); *G01R 22/00* (2013.01)

(58) Field of Classification Search
USPC ......... 324/76.11, 510, 511, 691; 62/236, 219, 62/351, 172; 700/286, 295, 297, 291; 702/61, 60; 307/31, 23, 130, 131, 24, 307/26; 363/44, 67
See application file for complete search history.

(56) References Cited

U.S. PATENT DOCUMENTS

| | | | |
|---|---|---|---|
| 5,973,491 A * | 10/1999 | Onizuka et al. | 363/124 |
| 8,461,861 B2 | 6/2013 | Botts | |
| 2004/0015570 A1* | 1/2004 | Daum et al. | 709/220 |
| 2009/0021219 A1* | 1/2009 | Yoda et al. | 320/137 |
| 2010/0073351 A1* | 3/2010 | Lin et al. | 345/212 |
| 2010/0117625 A1* | 5/2010 | Botts | 324/103 R |
| 2010/0201348 A1* | 8/2010 | Wan | 324/142 |

FOREIGN PATENT DOCUMENTS

CN        102209901 A     10/2011
WO    WO 2010/054991      5/2010

OTHER PUBLICATIONS

Chinese Office Action dated May 29, 2015 for Chinese Appin. No. 201310231558.6, with English Translation, 17 pages.

* cited by examiner

*Primary Examiner* — Melissa Koval
*Assistant Examiner* — Nasima Monsur
(74) *Attorney, Agent, or Firm* — Fish & Richardson P.C.

(57) ABSTRACT

An appliance includes an operation unit that is mounted in a case of the appliance that is supplied power by an external power supply and that includes at least one of a motor and a heating member. The appliance further includes a control circuit mounted in the case of the appliance and configured to control the operation unit to perform appliance functionality that is different than measuring power. The appliance further includes a power meter coupled to the control circuit, built into the case, and configured to measure power consumed by the appliance in performing the appliance functionality.

16 Claims, 3 Drawing Sheets

HOME APPLIANCE HAVING BUILT-IN POWER METER

Pursuant to 35 U.S.C. §119(a), this application claims the benefit of earlier filing date and right of priority to Korean Application No. 10-2012-0062579 filed on Jun. 12, 2012, the contents of which are hereby incorporated by reference herein in their entirety.

FIELD

The present disclosure relates to a home appliance having a built-in power meter configured to measure and observe power consumption of the home appliance.

BACKGROUND

There are various electric home appliances that operate on supplied power including refrigerators, washing machines, dishwashers, air conditioners, cooking apparatuses, televisions, vacuum cleaners, electric pads and electric rice cookers.

Such electric home appliances are supplied alternating current power supply from an external power supply when put into operation. A watt-hour meter is installed in every house to measure watts consumed in the house.

Recently, there is a growing interest and demand for power-saving, for example, using power-saving products or using relatively low-priced off-peak electricity.

Some electric home appliances have power or wattage consumption determined during the manufacturing process and noted on the appliance.

However, to measure the power or wattage substantially consumed by a specific home appliance, an auxiliary watt-hour meter (namely, a power meter) is typically connected to the specific home appliance.

SUMMARY OF THE DISCLOSURE

An innovative aspect of the subject matter described in this disclosure may be embodied in an appliance that includes an operation unit that is mounted in a case of the appliance that is supplied power by an external power supply and that includes at least one of a motor and a heating member; a control circuit mounted in the case of the appliance and configured to control the operation unit to perform appliance functionality that is different than measuring power; and a power meter coupled to the control circuit, built into the case, and configured to measure power consumed by the appliance in performing the appliance functionality.

These and other embodiments can each optionally include one or more of the following features. The power meter includes a voltage-current measuring unit connected to an external power supply and configured to measure voltage and current supplied by the external power supply; and an electric power calculation unit configured to calculate an amount of power based on the voltage and current measured by the voltage-current measuring unit and configured to output the calculated amount of power to the control circuit. The external power supply is an alternating current power supply, and the control circuit includes a rectifier configured to rectify alternating current power received from the alternating current power supply into direct current power; a transformer configured to lower voltage of the direct current power; a first regulator configured to regulate voltage of the direct current power lowered by the transformer; and a microcomputer configured to control the appliance and configured to receive the direct current power regulated by the first regulator.

The electric power calculation circuit is connected to the microcomputer and configured to transmit data on the calculated amount of power to the microcomputer, and the electric power calculation circuit determines to calculate the amount of power based on a control of the microcomputer. A photocoupler is between the electric power calculation circuit and the microcomputer. The electric power calculation circuit is configured to be supplied the direct current power lowered by the transformer. The control circuit further includes a rectifier circuit connected to the transformer to rectify the power lowered by the transformer, and the electric power calculation circuit is connected to the rectifier circuit and is supplied rectified power from the rectifier circuit. The power meter further includes a second regulator connected between the rectifier circuit and the electric power calculation circuit and configured to lower voltage of the power rectified by the rectifier circuit. The second regulator is a Low Drop-Out (LDO) regulator.

The electric power calculation circuit is supplied power from a power supply circuit for the electric power calculation circuit. The power supply circuit is connected to the alternating current power supply. The appliance further includes a display configured to display control and operational states of the appliance. The control circuit controls the display to display the amount of power consumed by the appliance. The appliance is a refrigerator, a washing machine, an air conditioner, or a cooking apparatus. The external power supply and the energy calculation circuit are connected to a first ground and the microcomputer is connected to a second ground that is different from the first ground. The appliance further includes a photocoupler between the energy calculation circuit and the microcomputer, wherein the photocoupler is connected to both the first ground and the second ground.

Another innovative aspect of the subject matter described in this disclosure may be embodied in an appliance that includes an operation unit that is mounted in a case of the appliance that is supplied power by an external power supply and that includes at least one of a motor and a heating member; a control circuit mounted in the case of the appliance and configured to control the operation unit to perform appliance functionality that is different than measuring power; and power meter means for measuring power consumed by the appliance in performing the appliance functionality.

These and other embodiments can each optionally include one or more of the following features. The power meter means is connected to the control circuit, is built into the case, and includes a voltage-current measuring unit connected to an external power supply and configured to measure voltage and current supplied by the external power supply; and an electric power calculation unit configured to calculate an amount of power based on the voltage and current measured by the voltage-current measuring unit and configured to output the calculated amount of power to the control circuit.

The external power supply is an alternating current power supply, and the control circuit includes a rectifier configured to rectify alternating current power received from the alternating current power supply into direct current power; a transformer configured to lower voltage of the direct current power; a first regulator configured to regulate voltage of the direct current power lowered by the transformer; and a microcomputer configured to control the appliance and configured to receive the direct current power regulated by the first regulator. The electric power calculation circuit is connected to the microcomputer and configured to transmit data on the calculated amount of power to the microcomputer, and the electric power calculation circuit determines to calculate the amount of power based on a control of the microcomputer. A photocoupler is between the electric power calculation circuit and the microcomputer.

Another innovative aspect of the subject matter described in this disclosure may be embodied in a method that includes receiving, at an operation unit that is mounted in a case of an appliance, power that is supplied by an external power supply, the operation unit including at least one of a motor and a heating member; controlling, by a control circuit mounted in the case of the appliance, the operation unit to perform appliance functionality that is different than measuring power; and measuring, by a power meter connected to the control circuit and built into the case, power consumed by the appliance in performing the appliance functionality.

DETAILED DESCRIPTION

Figure 1:
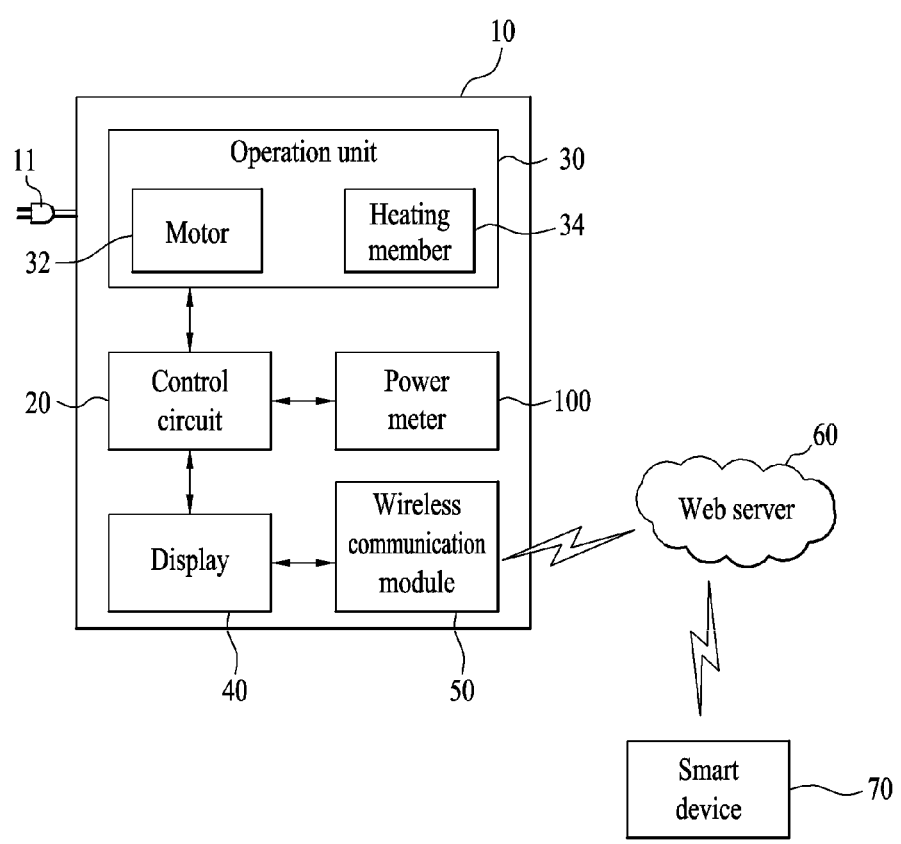
FIG. 1 illustrates a structure of an example home appliance.

FIG. 1 illustrates a structure of an example home appliance 10.

The home appliance 10 includes a control circuit 20 mounted in a case thereof to be supplied the external power and a power meter 100 mounted in the case to measure the consumption of the external power in a state of being connected with the control circuit board.

The home appliance 10 is an electric appliance operated by electricity. Examples of the home appliance may include a refrigerator, a washing machine, a dishwasher, an air conditioner, a cooking apparatus, a television, a vacuum cleaner, an electric pad, an electric rice cooker and the like.

The electric home appliance 10 may use alternating current power supply supplied to houses.

Accordingly, a plug 11 is connected to the case of the home appliance 10 to supply the external power to the home appliance.

The plug 11 is put into an outlet installed in a house to allow the home appliance 10 to draw power.

The home appliance 10 is configured to be controlled automatically, and it includes a control circuit 20 for the automatic control.

The control circuit 20 controls an operation unit 30 including a motor 32 or a heating member 34 according to the type of the home appliance 10. The external power is supplied to the operation unit 30 of the home appliance and to the control circuit 20.

The rated currents and rated voltages supplied to the control circuit 20 can be different from the rated currents and rated voltages supplied to the operation unit 30 of the home appliance. Accordingly, the electricity supplied to the control circuit 20 may be appropriately converted before supplied to the control circuit 20, which will be described in more detail later.

The power meter 100 is connected with the control circuit 20 that is supplied the external power supply. The power meter 100 measures the consumption of the power drawn from the external power supply (the amount of the consumed electricity).

Multiplying voltages and currents results in the electricity. Multiplying the electricity by the time results in the amount of electricity.

Accordingly, the power meter 100 measures voltages and currents consumed from the external power supply. The power meter 100 multiplies the measured voltages and currents and then multiplies the result by the time to compute the amount of electricity.

The home appliance 10 may further include a display 40 configured to display the operational state of the home appliance 10 and the display 40 may have an input unit to control an operation of the home appliance 10.

The home appliance 10 may further include a wireless communication module 50 configured to communicate with a computer or a smart device 70, such as a smart phone, via a web server 60. The wireless communication module 50 may be connected to the display 40 or the control circuit 20.

The wireless communication module 50 may use Wi-Fi or Zigbee.

With this configuration, the user can check the operational state of the home appliance remotely via the smart device 70 and input a command to control the home appliance.

Figure 2:
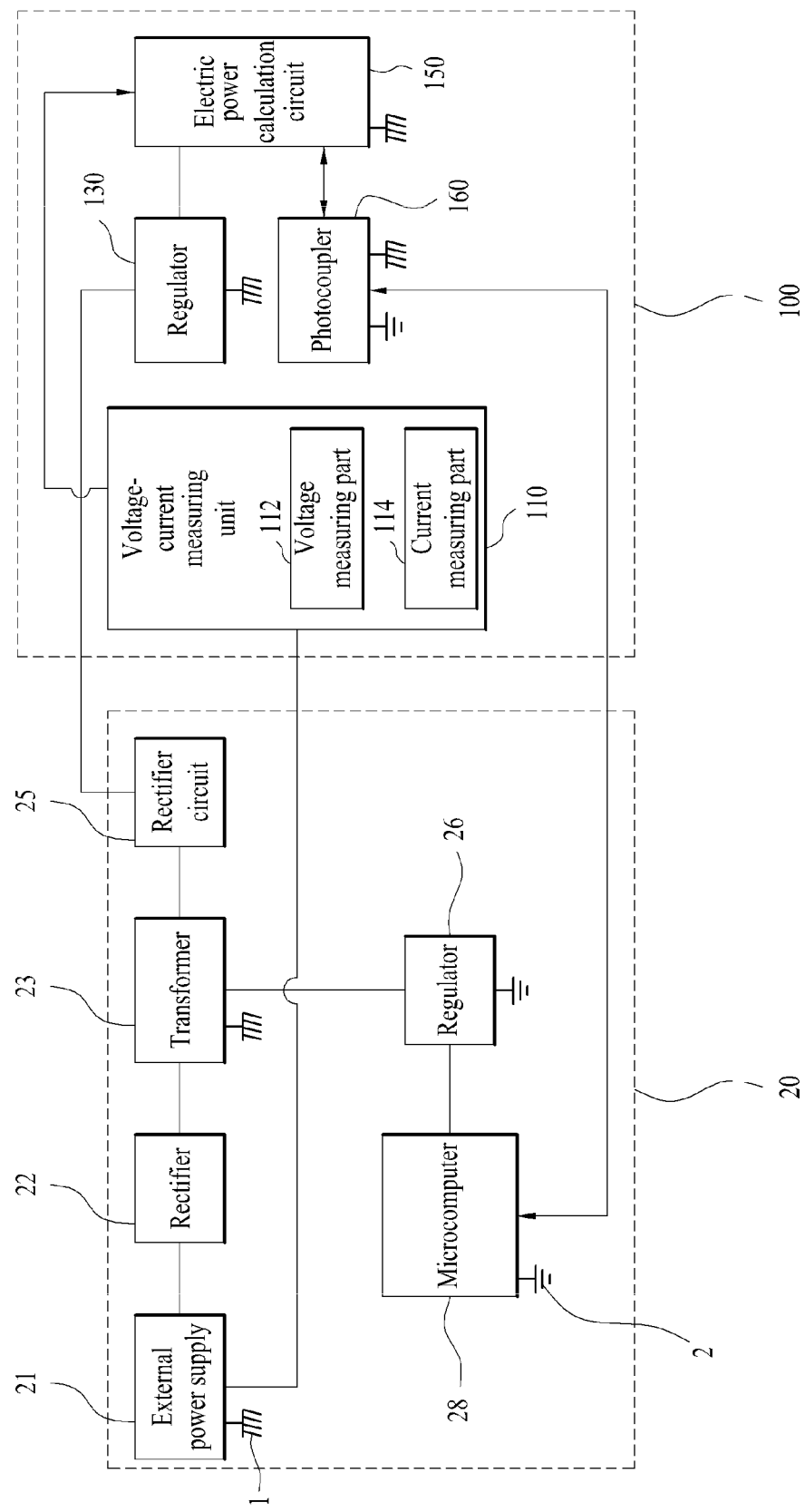
FIG. 2 illustrates a structure of an example power meter built in the home appliance and an example connection between a control circuit and the power meter.

FIG. 2 illustrates an example structure of a power meter built in the home appliance and an example connection between a control circuit and the power meter.

The power meter 100 may include a voltage-current measuring unit 110 connected to the external power supply to measure voltages and currents of the external power supply and an electric power calculation circuit 150 configured to calculate the amount of electricity based on the voltages and currents measured by the voltage-current measuring unit so as to output the calculated amount to the control circuit 20.

As shown in FIG. 2, the voltage-current measuring unit 110 is directly connected to the external power supply 21 for measuring the voltages and currents of the external power supply 21 that operate the home appliance 10.

Accordingly, the voltage-current measuring unit 110 includes a voltage measuring part 112 connected with the external power supply 21 in parallel and a current measuring part 114 connected with the external power supply 21 in series.

The voltage measuring part 112 is connected with the external power supply 21 in parallel and may include two resistances connected in series.

The current measuring part 114 is connected with the external power supply 21 in series and may include a shunt resistance.

The values of the voltages and currents measured by the voltage-current measuring unit 110 are transmitted to the electric power calculation circuit 150 and the electric power calculation circuit 150 calculates the amount of the electricity consumed by multiplying the measured voltages and the currents and then multiplying the result by the time.

The control circuit 20 may include a rectifier 22 configured to rectify the alternating current (AC) power into a direct current (DC) power, a transformer 23 configured to lower the voltage of the direct current power rectified by the rectifier 22, a regulator 26 configured to regulate the voltages of the DC power having passed the transformer 23, and a microcomputer 28 configured to control the operation of the home appliance by using the electric power supplied from the regulator 26.

The rectifier 22 rectifies the external power supply that is supplied as sine-wave alternating current power supply and converts the external power into DC power.

The transformer 23 lowers the voltages of the external power supply 21 into appropriate voltages usable by the microcomputer 28.

The regulator 26 regulates the voltages of the power having passed the transformer 23 and supplies the regulated DC power to the microcomputer 28.

The microcomputer 28 is operated by the voltage-lowered DC power and controls the operation of the home appliance 20. The microcomputer 28 may control the display 40 to display an operational state of the home appliance 20 and implement a control command input by the user.

The electric power calculation circuit 150 is connected with the microcomputer 28 and transmits data of the measured electric energy to the microcomputer 28. Also, the electric power calculation circuit 150 may determine whether to measure the amount of the electricity based on the control of the microcomputer 28.

To determine whether to measure the amount of electricity, a device for wired or wireless communication may be connected between the electric power calculation circuit 150 and the microcomputer 28.

Examples of such a communication device include a UART (Universal Asynchronous Receiver/Transmitter).

The UART is a hardware device configured to automatically perform serial-parallel data conversion necessary for asynchronous communication.

A photocoupler 160 is disposed before the electric power calculation circuit 150 is connected to the microcomputer 28 via the communication device, to electrically isolate a transmitter and a receiver with respect to a signal.

The electric power calculation circuit 150 may receive the electricity that passes through the transformer 23 of the control circuit 20.

The electric energy circulation unit 150 is the circuit configured to calculate the amount of the electricity from the voltage value and the current value input from the voltage-current measuring unit 110. Typically, the power for operating the electric energy circulation unit 150 can be the electric power having lower voltages, compared with voltages of the external power supply.

If the electric power calculation circuit 150 receives the electric power having passed the transformer 23, the electric power calculation circuit 150 may be supplied the lowered voltage power, with no auxiliary transformer.

The control circuit 20 may further include a rectifier circuit 25 connected to the transformer 23 to rectify the power having passed through the transformer. The electricity energy calculation circuit 150 is connected to the rectifier circuit 25 to be supplied the rectified electricity.

The electricity having passed through the transformer 23 is typically rectified via the rectifier 22. However, the rectifier 22 is composed of one rectifier element such as a diode and it flows negative or positive electricity there to perform half wave rectification.

The rectifier circuit 25 reverses the negative or positive electricity into the other and performs full wave rectification. Also, the rectifier circuit 25 includes a condenser and can smooth out electricity.

The power meter 100 may further include a regulator 130 connected between the rectifier circuit 25 and the electric power calculation circuit 150 to lower voltages of the electricity having passed through the rectifier circuit 25 into properly lowered voltages.

The transformer 23 is configured to lower the voltages of the electricity supplied to the microcomputer 28 into properly lowered voltages. The voltages of the electricity used for the microcomputer 28 may be different from rated voltages of the electricity used for the electric power calculation circuit 150.

Accordingly, the regulator 130 may regulate the DC power having the voltages lowered by the rectifier circuit 25 into DC power having more properly lowered voltages.

The regulator 130 may be a Low Drop-out (LDO) regulator, different from the regulator 26 connected to the microcomputer 28.

For example, the electricity having 5V lowered by the rectifier circuit 25 is regulated into the electricity having 3.3V that will be supplied to the electric power calculation circuit 150.

Numeral references of "1" and "2" refer to grounds and a first ground 1 and a second ground 2 are different from each other.

In FIG. 2, the first ground 1 and the second ground 2 are shown differently.

For example, the external power supply 21 and the electric power calculation circuit 150 are grounded to the first ground 1. The regulator 26 and the microcomputer 28 are grounded to the second ground 2.

The photocoupler 160 is grounded to the first ground 1 and the second ground 2.

Figure 3:
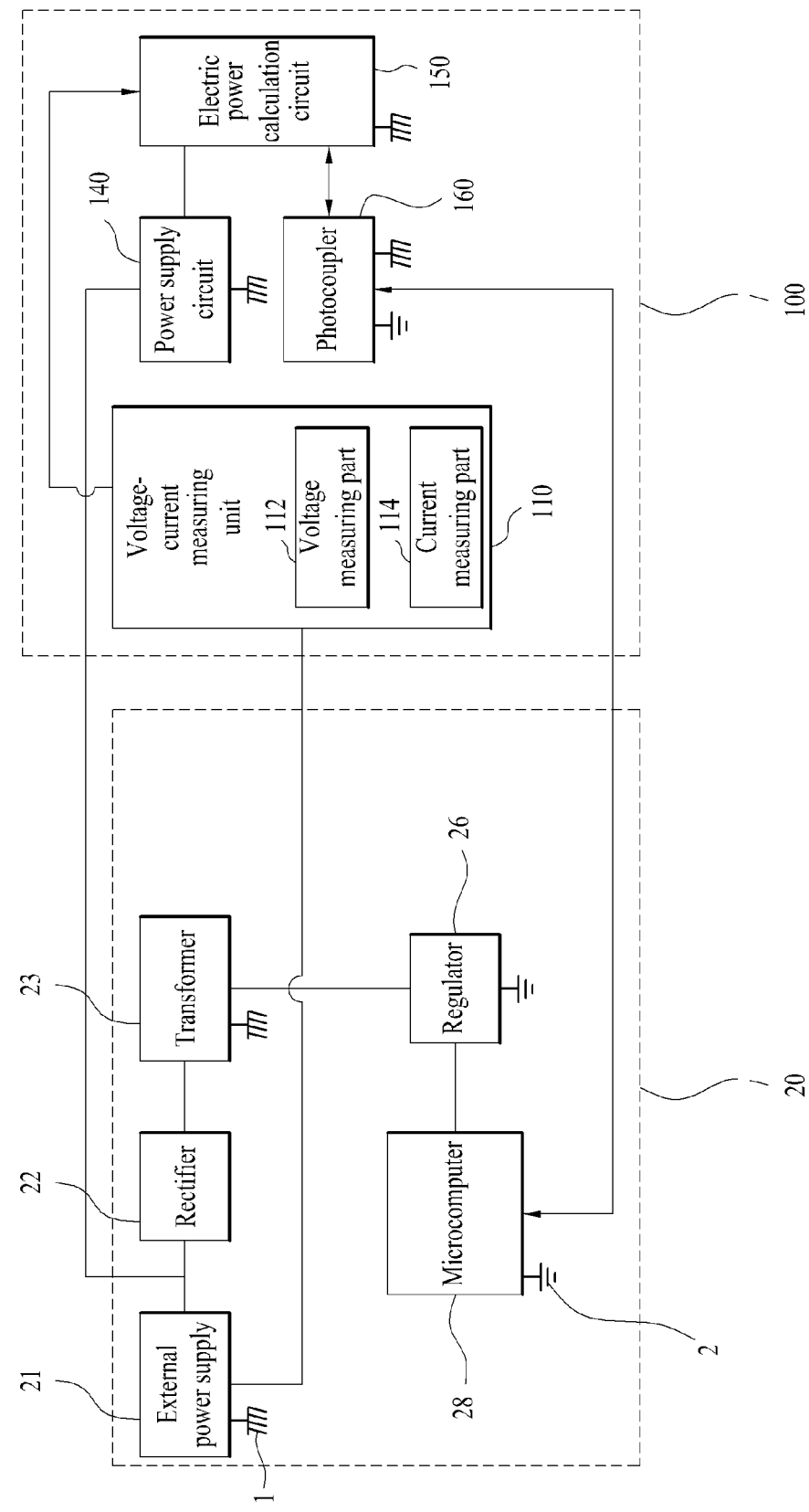
FIG. 3 illustrates a structure of an example power meter built in the home appliance and an example connection between a control circuit and the power meter.

FIG. 3 illustrates an example structure of a power meter built in the home appliance and an example connection between a control circuit and the power meter.

In FIG. 3, the electric power calculation circuit 150 is directly connected to the external power supply 21 to be supplied the electricity and a power supply circuit 140 is connected between the external power supply 21 and the electric power calculation circuit 150.

The electric power calculation circuit 150 may be supplied the electricity via the power supply circuit 140 for the electric power calculation circuit 150 that is directly connected to the external power supply 21.

The rectifier circuit 25 of FIG. 2, which is disposed between the transformer 23 and the regulator 130 of FIG. 2, is omitted in FIG. 3. However, the power supply circuit 140 for the electric power calculation circuit rectifies the external power supply 21 and converts (or lowers) voltages of the external power supply 21 to regulate the external power supply. After that, the regulated external power supply is supplied to the electric power calculation circuit 150.

Data of the electric energy calculated by the electric power calculation circuit 150 is transmitted to the microcomputer 28 via the photocoupler 160 and a UART.

As shown in FIG. 1, the microcomputer 28 of the control circuit 20 controls the display 40 to display the received data on the amount of the electricity, such that the user can be notified of the electricity consumed by the home appliance.

In addition, the display 40 is connected to the wireless communication module 50 such that the user can check the power consumption displayed on the user's smart phone or smart TV or the smart device 70, such as a computer, via the web server 60.

The user can input a control command of controlling the home appliance via the input unit provided in the display according to a control or operational state of the home appliance displayed on the display 40. Also, the user can command to selectively measure the power consumption of the home appliance or the display to selectively display the measured power consumption.

The home appliance having the built-in power meter may be a refrigerator, a washing machine, an air conditioner, or a cooking apparatus.

The power meter may be built in a home appliance having relatively high power consumption. Those electric home appliances mentioned above belong to the home appliances having high power consumption. Accordingly, the power meter may be built in one of those home appliances and can measure the power consumption such that the home appliance can save power.

Although implementations have been described with reference to a number of illustrative examples thereof, it should be understood that numerous other modifications and implementations can be devised by those skilled in the art that will fall within the spirit and scope of the principles of this disclosure. More particularly, various variations and modifications are possible in the component parts and/or arrangements and fall within the scope of the disclosure, the drawings and the appended claims. In addition to variations and modifications in the component parts and/or arrangements, alternative uses will also be apparent to those skilled in the art.

What is claimed is:

1. An appliance comprising:
    an operation unit that is mounted in a case of the appliance that is supplied alternating current power by an external power supply and that includes at least one of a motor and a heating member;
    a control circuit mounted in the case of the appliance and configured to control the operation unit to perform appliance functionality that is different than measuring power, wherein the control circuit comprises:
        a rectifier configured to rectify alternating current power received from the external power supply;
        a transformer configured to lower voltage of the rectified alternating current power;
        a first regulator configured to regulate voltage of the rectified alternating current power lowered by the transformer; and
        a microcomputer configured to control the appliance and configured to receive the rectified alternating direct current power regulated by the first regulator; and
    a power meter coupled to the control circuit, built into the case, and configured to measure power consumed by the appliance in performing the appliance functionality, wherein the power meter comprises:
        a voltage-current measuring unit connected to the external power supply and configured to measure voltage and current supplied by the external power supply; and
        an electric power calculation circuit configured to calculate an amount of power based on the voltage and current measured by the voltage-current measuring unit and configured to output the calculated amount of power to the control circuit.

2. The appliance according to claim 1, wherein the electric power calculation circuit is connected to the microcomputer and configured to transmit data on the calculated amount of power to the microcomputer, and
    wherein the electric power calculation circuit determines to calculate the amount of power based on a control of the microcomputer.

3. The appliance according to claim 2, wherein a photocoupler is between the electric power calculation circuit and the microcomputer.

4. The appliance according to claim 1, wherein the electric power calculation circuit is configured to be supplied the rectified alternating current power lowered by the transformer.

5. The appliance according to claim 1, wherein the control circuit further comprises:
    a rectifier circuit connected to the transformer to further rectify the alternating current power lowered by the transformer,
    wherein the electric power calculation circuit is connected to the rectifier circuit and is supplied rectified alternating current power from the rectifier circuit.

6. The appliance according to claim 5, wherein the power meter further comprises:
    a second regulator connected between the rectifier circuit and the electric power calculation circuit and configured to lower voltage of the rectified alternating current power rectified by the rectifier circuit.

7. The appliance according to claim 6, wherein the second regulator is a Low Drop-Out (LDO) regulator.

8. The appliance according to claim 3, wherein the electric power calculation circuit is supplied power from a power supply circuit for the electric power calculation circuit, wherein the power supply circuit is connected to the external power supply.

9. The appliance according to claim 1, further comprising:
    a display configured to display control and operational states of the appliance,
    wherein the control circuit controls the display to display the amount of power consumed by the appliance.

10. The appliance according to claim 9, wherein the appliance is a refrigerator, a washing machine, an air conditioner, or a cooking apparatus.

11. The appliance according to claim 1, wherein the external power supply and the electric power calculation circuit are connected to a first ground and the microcomputer is connected to a second ground that is different from the first ground.

12. The appliance according to claim 11, further comprising:
    a photocoupler between the electric power calculation circuit and the microcomputer, wherein the photocoupler is connected to both the first ground and the second ground.

13. An appliance comprising:
    an operation unit that is mounted in a case of the appliance that is supplied alternating current power by an external power supply and that includes at least one of a motor and a heating member;
    a control circuit mounted in the case of the appliance and configured to control the operation unit to perform appliance functionality that is different than measuring power, wherein the control circuit comprises:
        a rectifier configured to rectify alternating current power received from the external power supply into direct current power;
        a transforming circuit configured to lower voltage of the direct current power;
        a first regulator configured to regulate voltage of the direct current power lowered by the transforming circuit; and
        a microcomputer configured to control the appliance and configured to receive the direct current power regulated by the first regulator; and power meter means connected to the control circuit, built into the case, and configured to for measure power consumed by the appliance in performing the appliance functionality, wherein the power meter means comprises:
- a voltage-current measuring unit connected to the external power supply and configured to measure voltage and current supplied by the external power supply; and
- an electric power calculation circuit configured to calculate an amount of power based on the voltage and current measured by the voltage-current measuring unit and configured to output the calculated amount of power to the control circuit.

14. The appliance according to claim 13, wherein the electric power calculation circuit is connected to the microcomputer and configured to transmit data on the calculated amount of power to the microcomputer, and
wherein the electric power calculation circuit determines to calculate the amount of power based on a control of the microcomputer.

15. The appliance according to claim 14, wherein a photocoupler is between the electric power calculation circuit and the microcomputer.

16. An appliance comprising:
an operation unit that is mounted in a case of the appliance that is supplied alternating current power by an external power supply and that includes at least one of a motor and a heating member;
a control circuit mounted in the case of the appliance and configured to control the operation unit to perform appliance functionality that is different than measuring power, wherein the control circuit comprises:
- a rectifier configured to rectify alternating current power received from the external power supply;
- a transformer configured to lower voltage of the rectified alternating current power;
- a first regulator configured to regulate voltage of the rectified alternating current power lowered by the transformer; and
- a microcomputer configured to control the appliance and configured to receive the rectified alternating direct current power regulated by the first regulator; and a power meter coupled to the control circuit, built into the case, and configured to measure power consumed by the appliance in performing the appliance functionality.

* * * * *